United States Patent
Petrausch et al.

(10) Patent No.: US 10,306,378 B2
(45) Date of Patent: May 28, 2019

(54) METHOD FOR OPERATING A HEARING DEVICE

(71) Applicant: Sivantos Pte. Ltd., Singapore (SG)

(72) Inventors: Stefan Petrausch, Erlangen (DE); Thomas Pilgrim, Erlangen (DE)

(73) Assignee: Sivantos Pte. Ltd., Singapore (SG)

(*) Notice: Subject to any disclaimer, the term of this patent is extended or adjusted under 35 U.S.C. 154(b) by 1 day.

(21) Appl. No.: 15/804,464

(22) Filed: Nov. 6, 2017

(65) Prior Publication Data

US 2018/0132045 A1 May 10, 2018

(30) Foreign Application Priority Data

Nov. 4, 2016 (DE) .......................... 10 2016 221 692

(51) Int. Cl.
*H04R 25/00* (2006.01)
*H03M 1/18* (2006.01)

(52) U.S. Cl.
CPC .......... *H04R 25/505* (2013.01); *H03M 1/185* (2013.01); *H04R 2225/43* (2013.01); *H04R 2430/01* (2013.01)

(58) Field of Classification Search
CPC . H03M 1/185; H04R 25/505; H04R 2225/43; H04R 2430/01
USPC ........................................................ 381/317
See application file for complete search history.

(56) References Cited

U.S. PATENT DOCUMENTS

| | | | |
|---|---|---|---|
| 6,628,795 B1 * | 9/2003 | Ludvigsen | H04R 25/356 381/107 |
| 2004/0008132 A1 | 1/2004 | Leenen | |
| 2012/0201400 A1 | 8/2012 | Ayres | |

FOREIGN PATENT DOCUMENTS

| | | |
|---|---|---|
| DE | 60119129 T2 | 2/2007 |
| EP | 2485395 B1 | 5/2013 |
| GB | 2 057 228 A | 3/1981 |
| WO | WO 1999/034642 A1 | 7/1999 |
| WO | WO 01/26418 A1 | 4/2001 |
| WO | WO 02/17496 A1 | 2/2002 |

OTHER PUBLICATIONS

Australian First Office Action dated Jun. 7, 2018 issued by the Australian Patent Office in corresponding application 2017232071.

* cited by examiner

*Primary Examiner* — Phylesha Dabney
(74) *Attorney, Agent, or Firm* — Muncy, Geissler, Olds & Lowe, P.C.

(57) ABSTRACT

A method for operating a hearing device, in particular a hearing aid device, in which a first analog signal is provided. A second analog signal is generated by a preamplifier based on the first analog signal, and a first digital signal is generated by an A/D converter based on the second analog signal. A second digital signal is generated by an amplifier based on the first digital signal, and a third digital signal, in which a noise is reduced in comparison with the second digital signal, is generated by a noise suppression unit based on a second digital signal. The preamplifier, amplifier, and noise suppression unit are set using a value characterizing the first digital signal.

10 Claims, 5 Drawing Sheets

| 2 | Hearing device |
|---|---|
| 4 | Microphone |
| 6 | Preamplifier |
| 8 | A/D converter |
| 10 | Amplifier |
| 12 | Noise suppression unit |
| 14 | Digital sound processor |
| 16 | Receiver |
| 18 | Control unit |
| 20 | Sound |
| 22 | First analog signal |
| 24 | Second analog signal |
| 26 | First digital signal |
| 28 | Second digital signal |
| 42 | Characterizing value |
| 52 | Third digital signal |

| 2  | Hearing device |
| 4  | Microphone |
| 6  | Preamplifier |
| 8  | A/D converter |
| 10 | Amplifier |
| 12 | Noise suppression unit |
| 14 | Digital sound processor |
| 16 | Receiver |
| 18 | Control unit |
| 20 | Sound |
| 22 | First analog signal |
| 24 | Second analog signal |
| 26 | First digital signal |
| 28 | Second digital signal |
| 42 | Characterizing value |
| 52 | Third digital signal |

| 38 | First working step |
| 40 | Second working step |
| 44 | Third working step |
| 46 | Fourth working step |
| 48 | Fifth operating step |
| 50 | Sixth operating step |

| 12 | Noise suppression unit |
| 28 | Second digital signal |
| 42 | Characterizing value |
| 52 | Third digital signal |
| 54 | First level adjustment unit |
| 56 | Suppression unit |
| 58 | Second level adjustment unit |
| 60 | Wiener filter |
| 62 | Noise level meter |
| 64 | Noise floor |
| 66 | Adaption unit |
| 68 | First digital auxiliary unit |
| 70 | Second digital auxiliary unit |

METHOD FOR OPERATING A HEARING DEVICE

This nonprofitional application claims priority under 35 U.S.C. § 119(a) to German Patent Application No. 10 2016 221 692.9, which was filed in Germany on Nov. 4, 2016, and which is herein incorporated by reference.

BACKGROUND OF THE INVENTION

Field of the Invention

The invention relates to a method for operating a hearing device. The hearing device is preferably a hearing aid device. The invention relates further to a hearing device of this kind.

Description of the Background Art

Persons who suffer from a reduction in hearing ability usually use a hearing aid device. In this case, an ambient sound is usually detected by means of an electromechanical acoustic transducer. The detected electrical signals are processed by an amplifier circuit and introduced into the ear canal of the person by a further electromechanical transducer. Various types of hearing aid devices are known. The so-called "behind-the-ear devices" are worn between the skull and the auricle. In this case, the amplified sound signal is introduced into the ear canal by means of a sound tube. A further common design of a hearing aid device is an "in-the-ear device" in which the hearing aid device itself is inserted into the ear canal. Consequently, the ear canal is at least partially closed by this hearing aid device, so that, apart from the sound signals generated by the hearing aid device, no other sound can penetrate into the ear canal, or only to a greatly reduced extent.

In order to achieve a miniaturization as great as possible of the hearing aid device, they are usually made using digital technology. In this case, an analog input signal is converted by an A/D converter to a digital signal which is adapted to the needs of the hearing-impaired person by a signal processor. A normal hearing spectrum comprises a range of up to 130 dB. An A/D conversion over such a hearing spectrum range is not possible by means of a relatively small hearing aid device. Consequently, only a certain range of the hearing spectrum can be processed by the signal processor. In the case of a relatively large input signal, the A/D converter can overdrive, which leads to unwanted distortions ("clippings"). If, in contrast, the input signal is too small, only a relatively poor signal-to-noise ratio ("S/N ratio") is available.

To counteract these effects, the hearing aid device usually has an analog preamplifier, whose signal is routed to the digital signal processor via the A/D converter. In this case, the preamplifier ensures that the signal supplied to the amplifier always remains below a certain limit level, so that the introduction of undesirable artifacts is prevented. However, in the case of a relatively low gain of the preamplifier, therefore, when a relatively pronounced input signal is or was present, and the preamplifier is controlled still further with the low gain, any noise introduced by the A/D converter is amplified relatively strongly by the amplifier. This is partly perceptible by the hearing aid device wearer and leads to an undesirable acoustic impression. If, at periodic intervals, relatively strong sound signals occur, therefore, a noise is always perceptible subsequently for the hearing aid device wearer for a certain period of time, which is unpleasant.

SUMMARY OF THE INVENTION

It is therefore an object of the invention to provide an especially suitable method for operating a hearing device as well as an especially suitable hearing device, an audio quality being improved in particular.

The method is used to operate a hearing device. For example, the hearing device is an earphone or comprises an earphone. However, the hearing device is particularly preferably a hearing aid device. The hearing aid device is used to assist a person suffering from a reduction in hearing ability. In other words, the hearing aid device is a medical device by means of which, for example, partial hearing loss is compensated. The hearing aid device is, for example, a "receiver-in-the-canal" hearing aid device (RIC), an in-the-ear hearing aid device, such as an "in-the-ear" hearing aid, an "in-the-canal" hearing aid device (ITC), or a "completely-in-canal" hearing aid device (CIC), hearing aid glasses, a pocket hearing aid device, a bone conduction hearing aid device, or an implant. The hearing aid device is particularly preferably a behind-the-ear hearing aid device, which is worn behind an auricle.

The method proposes that a first analog signal is provided. The first analog signal is, for example, an input signal. A second analog signal is generated by a preamplifier based on the first analog signal. The preamplifier expediently operates on the basis of analog technology. The first analog signal is amplified or attenuated, for example, to the second analog signal by the preamplifier. Preferably, the second analog signal corresponds to the amplified first analog signal. In particular, the second analog signal has a larger maximum amplitude and/or average amplitude than the first analog signal. The first analog signal is expediently amplified by the preamplifier in a broadband manner. In other words, individual frequencies are not changed specifically by the preamplifier. Rather, all frequencies of the first analog signal are changed to the second analog signal by the preamplifier, in particular, in the same way.

In a subsequent working step, a first digital signal (word) is generated by an A/D converter ("analog-to-digital" converter) based on the second analog signal. The first digital signal has, for example, a depth of 16 bits or 32 bits. For example, a further module by which the second signal is changed is switched in terms of signaling between the preamplifier and the A/D converter. Alternatively, to this end, the second analog signal is passed from the preamplifier directly to the A/D converter. The first digital signal preferably corresponds to the second analog signal transferred to the digital domain.

A second digital signal is generated by an amplifier based on the first digital signal. The amplifier is preferably a digital amplifier. In particular in this case, the first digital signal is amplified to the second digital signal. The second digital signal corresponds in particular to the amplified first digital signal. A third digital signal is generated by a noise suppression unit based on the second digital signal. In other words, the second digital signal is passed, for example, directly from the amplifier to the noise suppression unit in terms of signaling. Alternatively, to this end, a further module by means of which the second digital signal is changed is disposed between the amplifier and the noise suppression unit in terms of signaling. Noise in the second digital signal is attenuated by the noise suppression unit, so that a noise in the third digital signal is reduced in comparison with the second digital signal.

In particular, the third digital signal is divided into specific frequency bands by the amplifier or a frequency filter disposed between the amplifier and the noise suppression unit, wherein a noise in the particular frequency band is reduced by the noise suppression unit. In this case, the degree of reduction is in particular different between the individual frequency bands. In other words, the noise suppression by the noise suppression unit is frequency-dependent. The preamplifier, amplifier, and noise suppression unit are set using a value characterizing the first digital signal. In particular, the gain of the preamplifier and/or the amplifier is set using the characterizing value. Advantageously, an amplification factor of the preamplifier is reduced or a damping factor of the preamplifier is increased, if the level of the first digital signal is above a limit value. In other words, the level of the first digital signal is used in particular as a characterizing value.

Provided therefore that the first analog signal has a relatively high level, the first digital signal also has a relatively high level. In order to avoid formation of artifacts in the first digital signal, the amplification factor of the preamplifier is reduced so that the first digital signal has a reduced level. Consequently, the formation of artifacts due to the limited controllability of the A/D converter is avoided, in particular "clipping." Provided the level is below a second limit value, in particular a gain of the preamplifier is increased or a damping of the preamplifier is reduced. As a result, the second analog signal has an increased level. The noise introduced by the A/D converter is substantially constant. As soon as the second analog signal has an increased (signal) level, the first digital signal has an improved signal-to-noise ratio.

In summary, the second digital signal has a changed signal-to-noise ratio depending on the control of the preamplifier. This is taken into account by setting the noise suppression unit using the value by which the preamplifier is set, and thus the noise suppression unit is set to the changed control of the preamplifier, for which reason noise present in the second digital signal can be identified relatively effectively. As a result, the audio quality of the hearing device is improved.

For example, a stepless setting of the preamplifier is provided. Alternatively, to this end the preamplifier has a number of stages, each stage corresponding to a certain value range of the characterizing value. Particularly preferably, the preamplifier has only two settings. In other words, the second analog signal is generated either using a first setting or using a second setting. A computational effort is simplified in this way. For example, the difference of the amplification factor between the two settings is between 5 dB and 20 dB, between 10 dB and 15 dB, and is in particular equal to 10 dB, a deviation of +/−10%, 5%, 2, or 0% being included in particular.

Expediently, the third digital signal is passed on to a control unit, for example, a microchip, in particular a signal processor, by means of which a further adjustment of the third digital signal takes place. For example, a certain frequency band is attenuated or amplified by the control unit. Expediently, the type of adjustment of the third signal is adapted to the needs of a hearing device wearer. The signal processed in this way is preferably passed on to a receiver, which, for example, is designed in a digital manner. Alternatively, the signal is passed to a D/A converter ("digital-to-analog" converter) by means of which the receiver is driven. Suitably, the third digital signal is passed directly to the D/A converter or to the receiver.

For example, the characterizing value of the first digital signal is determined directly based on the first digital signal. For example, the characterizing value is measured directly. In an alternative, the characterizing value of the first digital signal is calculated based on the first analog signal, using the setting of the preamplifier and the A/D converter. In this way, the preamplifier can already be adjusted before the formation of artifacts due to an overdriving of the A/D converter due to a too high input level of the second analog signal.

The first analog signal is preferably provided by means of a microphone. In other words, the first analog signal is acquired by the microphone. In an alternative, the first analog signal is detected by means of a receiver. In this case, the receiver operates inductively, for example, or radio waves are received by means of the transmitter.

Suitably, the amplifier is set such that a gain ratio between the first analog signal and the second digital signal is constant. Consequently, if a gain of the preamplifier is increased, the gain of the amplifier is decreased and vice versa. As a result, a relatively large dynamic bandwidth of the hearing device is realized, wherein relatively small and inexpensive components can be used. The A/D converter as well is usually operated in its optimal operating range, the amplification factor of the hearing device being essentially unaffected.

For example, the characterizing value is always transmitted to the noise suppression unit and the preamplifier. Particularly preferably, however, only a change in the characterizing value is transmitted to the noise suppression unit. In particular, only the change is transmitted in this case to the preamplifier and the amplifier. Expediently, it is only transmitted whether the characterizing value is above or below a certain limit value. In this way, an amount of information/information depth to be transmitted is reduced.

Expediently, an adaptation rate of a noise level meter of the noise suppression unit is set using the characterizing value. In particular, a time constant of the noise level meter is reduced to an adaptive matching. A level of the second digital signal is detected during operation by the noise level meter. Suitably, the noise suppression unit has a noise level meter by means of which the noise level of the second digital signal is determined. The noise level here is, for example, the current level of the second digital signal or a time average value thereof. Alternatively or particularly preferably in combination therewith, the noise suppression unit has a noise level meter by means of which a noise floor of the second digital signal is detected. The adaptation rates of the noise level meters of the noise suppression unit are expediently set using the characterizing value. In summary, the time constants of the noise level meter are adapted to detect the level and/or the noise floor. Expediently, the adaptation rates/time constants are adapted only when the change in the characterizing value is transmitted to the noise suppression unit and/or when a setting of the preamplifier is changed. In this way, an adaptation of the noise suppression unit is set to the changed signal-to-noise ratio which is present in the first digital signal due to the changed control of the preamplifier. An expected noise in particular is determined by the noise level meter on the basis of certain properties of the second digital signal.

Expediently, an expected noise form is adjusted based on the characterizing value. In this case, for example, a threshold is adjusted by means of which a noise is identified. In particular, a noise is determined below a certain level of the second digital signal. These components of the second digital signal are removed by the noise suppression unit, so that the third digital signal does not have these components. However, the other components of the third digital signal preferably match those of the second digital signal. Alternatively or in combination therewith, a spectrum of the expected noise form (noise spectrum) is adjusted. In particular, insofar as further elements of the hearing device introduce a noise, for example, a microphone, the second digital signal has a noise which comprises different components. Due to the setting of the preamplifier, certain noise components are amplified, whereas the noise components introduced by the A/D converter are independent of the setting of the preamplifier. Thus, depending on the setting of the preamplifier, the spectrum of the noise is different. By adjusting the expected noise form, in particular of the spectrum, within the noise suppression unit, this is adjusted to the changed noise components so that they can be identified and reduced relatively efficiently.

For example, in the case of production, the noise forms/noise spectra obtained with certain settings of the preamplifier are measured. In particular, these forms are stored in the noise suppression unit as a function of the particular setting of the preamplifier. Expediently, the preamplifier has only two different settings depending on the characterizing value, so that only two expected noise forms/noise spectra are stored in the noise suppression unit, which reduces memory space. For example, the noise forms/noise spectra are determined separately for each hearing device. In particular, a test measurement is carried out with the hearing device and/or during operation of the hearing device, for example, by carrying out a specific hearing device program. Alternatively, the particular spectrum of the noise form is determined for each type of hearing device and stored in each hearing device of the particular type.

For example, the noise suppression unit has a first level adjustment unit and a second level adjustment unit. A first digital auxiliary signal is generated based on the second digital signal by the first level adjustment unit. A second digital auxiliary signal is generated based on the first digital auxiliary signal by a noise level meter of the noise suppression unit. The second digital auxiliary signal corresponds here to a noise floor in the first digital auxiliary signal. A noise floor which corresponds to the noise of the second digital signal is generated based on the second digital auxiliary signal by the second level adjustment unit. In this case, the noise floor for the second digital auxiliary signal differs in particular only by the level.

For example, a level is reduced by the first/second level adjustment unit, so that the first digital auxiliary signal has a changed level compared with the second digital signal or the noise floor has a changed level compared with the second digital auxiliary signal. This change is, for example, broadband and constant for all frequencies. Alternatively, the level of certain frequencies is increased and/or decreased by the first/second level adjustment unit, so that the frequency spectrum of the first digital auxiliary signal is changed compared with the second digital signal or of the noise floor compared with the second digital auxiliary signal. In this regard, the change is either a shift of the frequency spectrum of the second digital signal and/or a distortion.

In particular, the second level adjustment unit is configured/operated inversely to the first level adjustment unit. In other words, the second level adjustment unit performs the inverse operation performed by the first level adjustment unit. The level of certain frequencies is thus changed by the second level adjustment unit, with each frequency being assigned, in particular, to the inverse factor which is used in the first level adjustment unit. The second digital signal is transformed to the first digital auxiliary signal by the first level adjustment unit; this ensures in particular that the first digital auxiliary signal corresponds to a specific operating range of the noise level meter. Preferably, the first level adjustment unit is set such that the level of the first digital auxiliary signal is always within a certain range. In particular, the first level adjustment unit ensures that the noise present in the first digital auxiliary signal always has a certain level value. In other words, the noise level of the first digital auxiliary signal is always the same. The noise is expediently determined in the first digital auxiliary signal using an adaptation. Due to the first level adjustment unit, an adaptation of the noise suppression unit, in particular of a suppression unit of the noise suppression unit, is influenced relatively little, so that the noise is always reliably detected. Expediently, the first level adjustment unit is controlled in such a way that an adaptation of the suppression unit is influenced relatively little when the preamplifier is changed.

Preferably, the first level adjustment unit and the second level adjustment unit are set using the characterizing value. The noise level meter is set, in particular, independently of the characterizing value. Expediently, the noise level meter is set once, for example, when the hearing device is manufactured. At any rate, however, the noise level meter is not set as a function of the characterizing value. Suitably, an expected noise level in the first digital auxiliary signal is maintained substantially constant by the first level adjustment unit, so that the expected noise level is substantially independent of the characterizing value. Consequently, the noise can be identified relatively reliably. The second digital auxiliary signal is again brought to the level of the second digital signal by the second level adjustment unit.

Preferably, a Wiener filter is used for generating the third digital signal based on the second digital signal. The Wiener filter is preferably a component of the suppression unit, if it is present. The Wiener filter enables a relatively efficient noise reduction.

In particular, the proportion of the reduction of the noise is set as a function of the characterizing value. In this case, the proportion to be reduced maximally is preferably changed here. In other words, the signal component identified as noise is set in the second digital signal as a function of the characterizing value. Preferably, the proportion of the noise reduction is increased when an amplification factor of the preamplification factor [sic, preamplifier?] is decreased. In particular, the proportion of the reduction of the noise is inversely proportional to the amplification factor of the preamplifier. In other words, the proportion of the reduction of the noise is increased if the amplification factor of the preamplifier is reduced. Due to the reduced gain, a noise introduced into the first digital signal by the A/D converter is increased as compared with the signal component of the first digital signal. By increasing the proportion of the reduction of the noise, a relatively efficient suppression of the noise is thus made possible. In particular, a signal component identified as noise is increased for this purpose. In other words, more signal components in the second digital signal are identified as noise, which is removed by the noise suppression unit, so that the third digital signal does not have this component.

The hearing device has a preamplifier and an A/D converter, connected downstream in terms of signaling. An amplifier is connected downstream of it in terms of signaling, and a noise suppression unit is connected downstream of the amplifier. The preamplifier is, in particular, an analog preamplifier, by means of which an analog signal is preferably amplified or attenuated during operation. The preamplifier expediently comprises a transistor. An analog signal in particular is converted to a digital signal during operation by the A/D converter. The A/D converter preferably comprises an operational amplifier. A digital signal is suitably changed and suitably amplified during operation by the amplifier. The noise suppression unit is suitable as well as provided and configured to attenuate noise in a signal, the signal being in particular a digital signal.

For example, the hearing device is an earphone or comprises an earphone. However, the hearing device is particularly preferably a hearing aid device. The hearing aid device is used to assist a person suffering from a reduction in hearing ability. In other words, the hearing aid device is a medical device by means of which, for example, partial hearing loss is compensated. The hearing aid device is, for example, a "receiver-in-the-canal" hearing aid device (RIC), an in-the-ear hearing aid device, such as an "in-the-ear" hearing aid, an "in-the-canal" hearing aid device (ITC), or a "completely-in-canal" hearing aid device (CIC), hearing aid glasses, a pocket hearing aid device, a bone conduction hearing aid device, or an implant. The hearing aid device is particularly preferably a behind-the-ear hearing aid device, which is worn behind an auricle.

The hearing device is provided and set up to be worn on the human body. In other words, the hearing device preferably comprises a holding device by means of which attachment to the human body is possible. Provided the hearing device is a hearing aid device, the hearing device is provided and set up to be placed, for example, behind the ear or within an ear canal. In particular, the hearing device is cordless and intended and set up to be inserted at least partially into an ear canal. For example, the hearing device is a component of a hearing device system which comprises a further hearing device or another device, such as a directional microphone or another device having a microphone.

The hearing device is suitable as well as intended and configured to carry out a method which stipulates that a first analog signal is provided. For example, the hearing device comprises a microphone by means of which the first analog signal is provided. A second analog signal is generated by the preamplifier based on the first analog signal, and a first digital signal is generated by the A/D converter based on the second analog signal. A second digital signal is generated by the amplifier based on the first digital signal, and a third digital signal is generated by the noise suppression unit by based on the second digital signal, in which noise is reduced in comparison with the second digital signal. The preamplifier, amplifier, and noise suppression unit are set using a value characterizing the first digital signal.

For example, the hearing device comprises a frequency filter by which the second digital signal is split. These frequency channels of the second digital signal are processed by the noise suppression unit to generate the third digital signal, the noise preferably being reduced in a frequency-selective manner. The third digital signal is expediently passed to a signal processor (DSP) by which a fourth signal is generated, by which, for example, special requirements are fulfilled. In particular, the fourth signal is adapted to a possible impairment of the hearing device wearer. Preferably, the third or fourth signal is forwarded to a receiver. During operation, the receiver generates sound waves, which are preferably introduced into the ear of the hearing device wearer. In particular, the receiver is an electromechanical acoustic transducer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
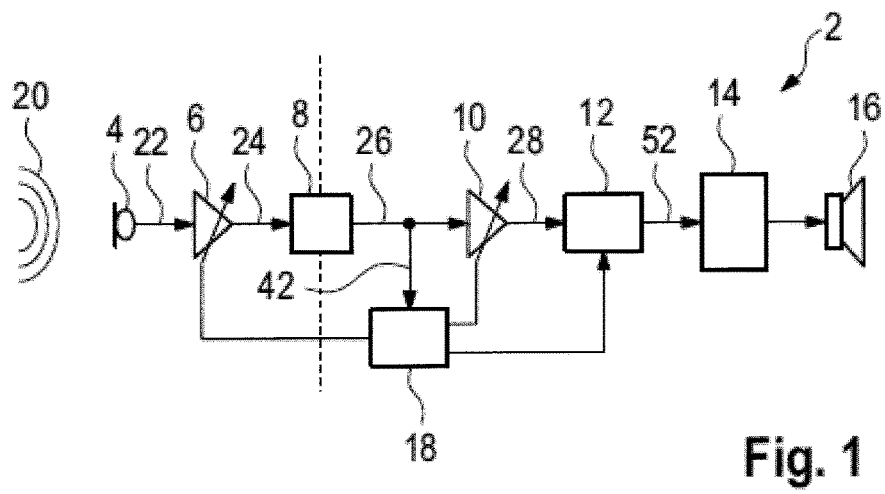
FIG. 1 schematically shows a hearing device comprising a preamplifier, an A/D converter, an amplifier, and a noise suppression unit.

FIG. 1 shows schematically simplified a hearing device 2 in the form of a hearing aid device. Hearing aid device 2 is used to assist a person suffering from a hearing impairment. Hearing device 2 has a microphone 4 and a preamplifier 6 connected downstream of it in terms of signaling. An A/D converter 8 is connected downstream of preamplifier 6 in terms of signaling, and an amplifier 10 is connected downstream of the converter. A noise suppression unit 12 is connected downstream of amplifier 10 in terms of signaling and a digital sound processor (DSP) 14 is connected downstream of the noise suppression unit. A receiver 16 is connected downstream of said processor in terms of signaling. Hearing device 2 also has a control unit 18.

When hearing device 2 is operated, a sound 20 is detected by microphone 4. This is converted into a first analog signal 22. In other words, first analog signal 22 is provided by microphone 4 and passed to preamplifier 6. A second analog signal 24, which is passed to A/D converter 8, is generated by preamplifier 6 based on first analog signal 22. In this regard, second analog signal 24 corresponds to amplified first analog signal 22. A first digital signal 26 is generated by A/D converter 8 based on second analog signal 24. First digital signal 26 corresponds to second analog signal 24, which is transferred to the digital domain. In this case, a noise is introduced into first digital signal 26 by A/D converter 8. First digital signal 26 is passed to amplifier 10 and a second digital signal 28 is generated by it, which corresponds to amplified first digital signal 26.

Preamplifier 6 has two setting steps, namely, a first setting 30 and a second setting 32, by means of which the gain ratio between second analog signal 24 and first analog signal 22 is set. Further, amplifier 10 also has two setting steps corresponding to those of preamplifier 6. In this case, amplifier 10 is set by control unit 18 such that the gain ratio between first analog signal 22 and second digital signal 28 is constant. If, therefore, the two gain stages (settings) of preamplifier 6 differ by, for example, 10 dB, the lower amplification factor of preamplifier 6 being selected in second setting 32, the gain stages of amplifier 10 also differ by 10 dB, and the gain is raised by 10 dB in second setting 32 of amplifier 10. At first setting 30, the amplification factor of preamplifier 6 is increased and that of amplifier 10 is decreased.

Figure 2:
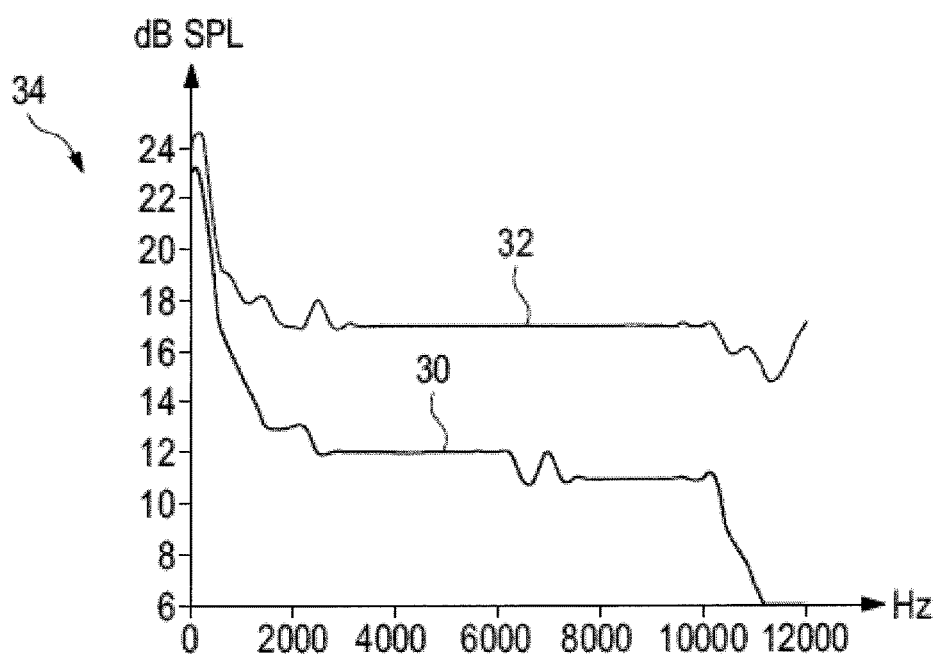
FIG. 2 illustrates a frequency spectrum of a noise as a function of a setting of the preamplifier.

Due to the two settings 30, 32, a frequency spectrum of a noise 34 results as shown in FIG. 2. In this case, noise 34 is increased at higher frequencies provided that preamplifier 6 and amplifier 10 are operated with second setting 32, therefore, if preamplifier 6 has the lower gain. In this case, the noise introduced into first digital signal 26 by A/D converter 8 is of the order of magnitude of the noise of microphone 4 and is amplified relatively strongly by amplifier 10 to second signal 28. If, in contrast, first setting 30 is selected and second analog signal 24 has a relatively high level, noise 34 introduced by the A/D converter is relatively low, so that the signal-to-noise ratio of first digital signal 26 and second digital signal 28 is improved. In other words, first digital signal 26 has a relatively high signal-to-noise ratio. First digital signal 26 is amplified to second digital signal 28 by amplifier 10.

Figure 3:
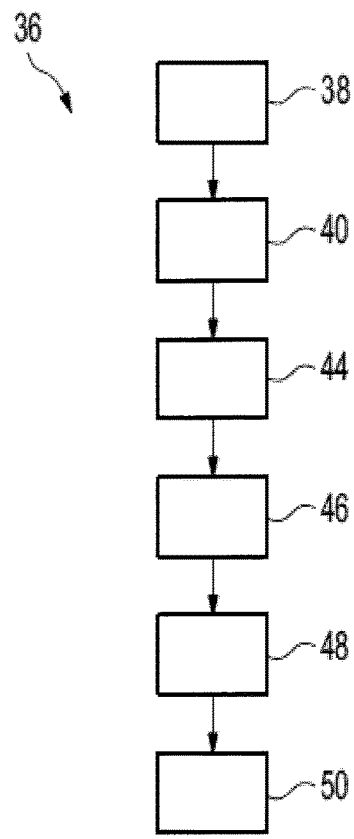
FIG. 3 shows a method for operating the hearing device.

FIG. 3 shows a method 36 for operating hearing device 2. In a first working step 38, first analog signal 22 is provided by microphone 4. In a subsequent second working step 40, a characterizing value 42 of first digital signal 26 is determined. Characterizing value 42 is the level of first digital signal 26. For this purpose, for example, the level of first analog signal 22 is detected. The resultant level of first digital signal 26 is calculated based on the settings and properties of preamplifier 6 as well as of A/D converter 8. Alternatively, the current level of first digital signal 26 is detected and used as an approximation for first analog signal 22, which is provided at the same time.

Preamplifier 6 and amplifier 10 are set using characterizing value 42. Provided characterizing value 42 is above a limit value, second setting 32 and, otherwise, first setting 30 are used. Accordingly, if sound 20 has a relatively low level, first analog signal 22 also has a relatively low level. Because preamplifier 6 is operated by means of first setting 30, the amplification factor of second digital signal 24 is increased to first analog signal 22. As a result, a noise introduced into first digital signal 26 by A/D converter 8 has a relatively low level. In other words, first digital signal 26 has a relatively high signal-to-noise ratio. First digital signal 26 is amplified to second digital signal 28 by amplifier 10.

If sound 20 has a high level and preamplifier 6 is operated with first setting 30, it could occur that A/D converter 8 is overdriven, for which reason artifacts would be introduced into first digital signal 26, in particular a so-called "clipping." Therefore, if characterizing value 42 is above the limit value, preamplifier 6 is operated with second setting 32, which is why a gain ratio of second analog signal 24 to first analog signal 22 is decreased. As a result, A/D converter 8 is operated at its optimum operating points even if first digital signal 28 has a deteriorated signal-to-noise ratio. First digital signal 26 is in turn amplified by amplifier 10 to second digital signal 28, the amplification factor of which is independent of characterizing value 42 with respect to first analog signal 22.

After characterizing value 42 is determined, second analog signal 24 is therefore generated in a third working step 44 by preamplifier 6 based on first analog signal 22, second analog signal 24 corresponding to amplified first analog signal 22. In a fourth working step 46, second analog signal 24 is converted to the digital domain by the A/D converter and thus first digital signal 26 is generated. Second digital signal 28, which is passed to noise suppression unit 12, is generated in a fifth operating step 48 by amplifier 10.

A third digital signal 52 is generated by noise suppression unit 12 in a sixth operating step 50, in which noise 34 is reduced as compared with second digital signal 28. Noise suppression unit 12 is also set using characterizing value 42, only changes in characterizing value 42 being transmitted to noise suppression unit 12. In particular, it is merely transmitted whether characterizing value 42 is above or below the limit value. Expediently, only the change, therefore, an overshooting or undershooting of the limit value, is also transmitted to preamplifier 6 and to amplifier 10 by control unit 18. Third digital signal 52 is passed to digital sound processor 14 by means of which hearing device 2 is adapted to the hearing damage of the wearer. This signal is output by means of receiver 16 into the ear canal of the wearer of hearing device 2. For this purpose, for example, the signal provided by digital sound processor 14 is converted into an analog signal, or receiver 16 is directly controlled with the digital signal.

Figure 4:
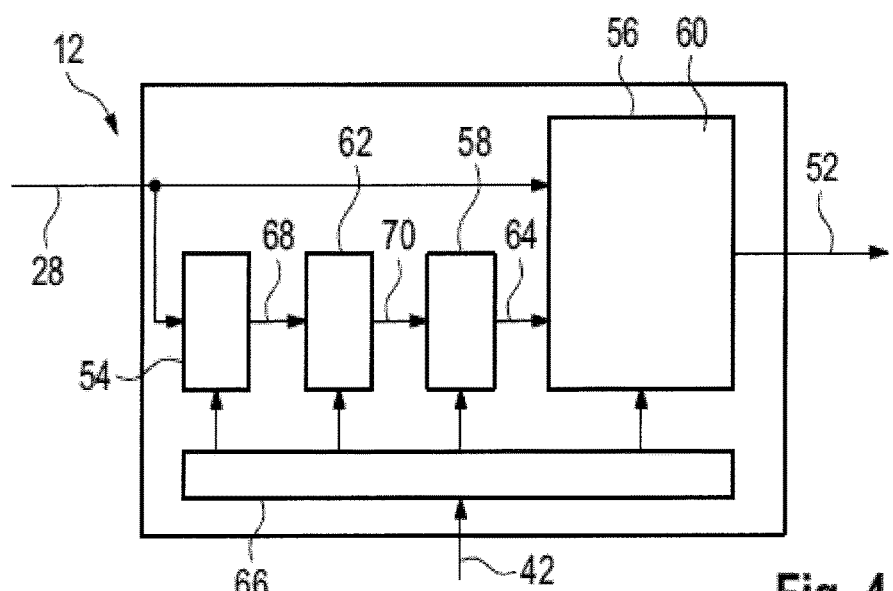
FIG. 4 schematically shows the noise suppression unit.

Noise suppression unit 12 is shown schematically in FIG. 4. Noise suppression unit 12 has a first level adjustment unit 54, a suppression unit 56, and a second level adjustment unit 58. Suppression unit 56 comprises a Wiener filter 60. Noise suppression unit 12 comprises a noise level meter 62 by means of which a noise level of a digital signal is detected, which is advantageously a noise floor 64 of a digital signal. Noise level meter 62 is switched in terms of signaling between first level adjustment unit 54 and second level adjustment unit 58. In addition, noise suppression unit 12 has an adaptation unit 66.

During operation, a first digital auxiliary signal 68, which is passed to noise level meter 62, is generated by first level adjustment unit 54 based on second digital signal 28. The level of first digital auxiliary signal 68 is thereby changed in comparison with that of second digital signal 28, and second digital signal 28 differs from first digital auxiliary signal 68 only in terms of the level. A noise is identified with noise level meter 62 within first digital auxiliary signal 68 and this is passed as second digital auxiliary signal 70 to second level adjustment unit 58. The level of second digital auxiliary signal 70 is changed by second level adjustment unit 58, and noise floor 64, which is a digital signal, is generated. In this case, noise floor 64 differs from second digital auxiliary signal 70 only in the level. The change in the level with second level adjustment unit 58 is hereby inverse to the change with first level adjustment unit 54.

Noise floor 64 and second digital signal 28 are passed to suppression unit 56, and the setting of Wiener filter 60 takes place using noise floor 64. Noise in second digital signal 28 is reduced by Wiener filter 60, and third digital signal 52 is generated by suppression unit 56 based on second digital second digital signal 28, the noise being reduced. The setting of first level adjustment unit 54, suppression unit 56, second level adjustment unit 58, and noise level meter 62 is determined adaptively, an adaptation rate being controlled by adaptation unit 66. In other words, a change in the noise floor in first digital auxiliary signal 68 is taken into account by adaptation unit 66, so that noise floor 64 is always determined efficiently by noise level meter 62 and second level adjustment unit 58.

Characterizing value 42 is used, for example, for setting first and second level adjustment units 54, 58. In this case, first level adjustment unit 54 ensures that first digital auxiliary signal 68 always has the same noise level, independent of the setting of preamplifier 6 and amplifier 10. In other words, the level is reduced in second setting 32 by first level adjustment unit 54. The inverse operation of first level adjustment unit 54 is carried out by second level adjustment unit 58, so that the level of third digital signal 52 substantially corresponds to second digital signal 28. In particular, there is no change in the setting of suppression unit 56 so that it is set independently of characterizing value 42. Due to the substantially constant noise level in first digital auxiliary signal 68, a continuous operation of noise level meter 62 is ensured even when preamplifier 6 is switched over. Noise floor 64, which is correctly reproduced even if the control of preamplifier 6 and amplifier 10 changes, is thus provided with the aid of second level adjustment unit 58. On this basis, noise suppression unit 56 is able to provide third digital signal 52 which comprises relatively few artifacts.

Alternatively or in combination therewith, an adaptation rate of noise level meter 62 is set by adaptation unit 66 using characterizing value 42. For this purpose, the time constants which are used for adaptation are expediently shortened, as long as switching of preamplifier 6 and amplifier 10 takes place, that is, in particular if characterizing value 42 falls below or exceeds the limit value. After a relatively short period of time after undershooting or overshooting, adaptation rate 66 is preferably set again to the original value. As a result, a possible jump in the behavior of noise 34 due to the changed control of preamplifier 6 and amplifier 10, as shown in FIG. 2, is corrected relatively rapidly. Thus, relatively few artifacts are present in third digital signal 52 due to the switching due to the faulty determination of noise floor 64.

In a further alternative, an expected noise form is adapted based on characterizing value 42. In other words, switching occurs between the two frequency spectra of noise 34 as shown in FIG. 2 depending on whether preamplifier 6 and amplifier 10 are operated based on first setting 30 or second setting 32. For this purpose, a noise floor 64 corrected by level adjustment units 54, 58 is provided to Wiener filter 60. In summary, noise suppression unit 12 is set based on characterizing value 42, by means of which preamplifier 6 as well as amplifier 10 are also set. As a result, noise 34 in second digital signal 28 is substantially constantly reduced by noise suppression unit 12 regardless of whether preamplifier 6 and amplifier 10 are operated with first setting 30 or second setting 32.

Figure 5:
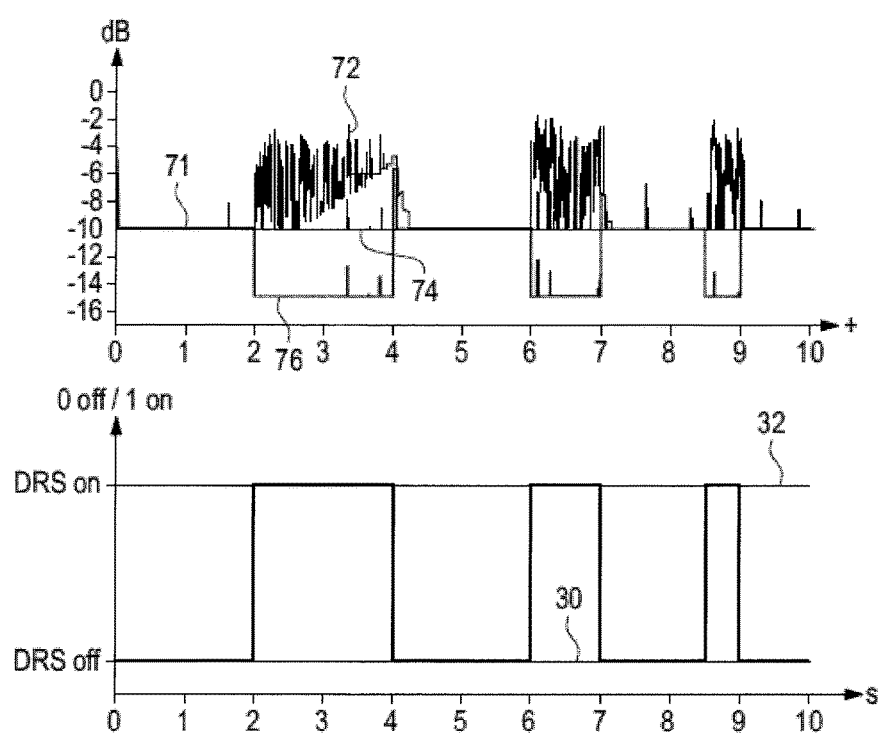
FIG. 5 shows the time profile of a noise suppression as a function of a setting of the preamplifier and the noise suppression unit.

A time profile of noise suppression 71 of suppression unit 56 and of the setting of preamplifier 6 and amplifier 10 is shown by way of example in FIG. 5. In this case, a first variant 72 of noise suppression 71 is shown if noise suppression unit 12 is operated independently of characterizing value 42. As soon as first setting 30 is switched to second setting 32, the signal-to-noise ratio of second digital signal 28 deteriorates. As a result, noise 34 is not completely recognized as noise, which is why it is then present in first variant 72 of third digital signal 52 if second setting 32 is selected.

If noise suppression unit 12 is adapted based on characterizing value 42, a second variant 74 of noise suppression 71 results. In this case, Wiener filter 60 operates with constant noise suppression, so that noise 34 is constantly reduced, irrespective of setting 30, 32 of preamplifier 6 and amplifier 10. Third digital signal 52 exhibits the same changes in noise 34. Second variant 74 differs from first variant 72, for example, in that the two level adjustment units 54, 58 are adjusted. Further, a third variant 76 of noise suppression 71 is shown in which the reduction of noise 34 is set as a function of characterizing value 42. Here, each time characterizing value 42 is above the limit, the reduction is increased. In other words, the noise in the suppression unit is reduced more greatly when second setting 32 is used. The reduction is, for example, 10 dB. As a result, the proportion of the reduction in noise 34 is increased, so that a substantially constant noise floor is reached in third digital signal 52.

In summary, noise suppression unit 12 is adjusted based on the setting of preamplifier 6 and amplifier 10, therefore, based on the operating point of the unit comprising preamplifier 6, A/D converter 8, and amplifier 10. In this case, the expected spectrum of noise 34 in particular in noise suppression unit 12 and/or a possible threshold of noise 34, therefore, a noise floor, are adjusted. This takes into account that noise 34 is amplified when the amplification factor of preamplifier 6 is decreased. As a result, a substantially constant noise floor is present in third digital signal 52 regardless of whether preamplifier 6 and amplifier 10 are operated with first setting 30 or second setting 32.

The switching between first setting 30 and second setting 32 is substantially abrupt, which is why the proportion of noise 34 present in second digital signal 28 is also increased abruptly. This is expediently taken into account by level adjustment unit 54, so that first digital auxiliary signal 68, which is passed to noise level meter 62, substantially has constant noise. The reduction (correction), which was carried out by first level adjustment unit 54, is compensated by second level adjustment unit 58. As a result, the functioning of noise level meter 62 is improved.

The adaptation rate of the two noise level meters 62 can also be varied by adaptation unit 66. In particular, the adaptation rate is shortened if characterizing value 42 falls below or exceeds the threshold value. In this way, a more rapid adaptation is made to the changed setting, therefore, to the operating point of the unit. By providing the spectrum of noise 34, which corresponds to the particular setting 30, 32, a relatively efficient suppression of noise 34 is made possible. In this case, for example, the two spectra of noise 34 are first measured and stored in noise suppression unit 12, the measurement taking place, for example, after the production of hearing device 2. In particular, the suppression of noise 34 is frequency-specific. In other words, noise suppression unit 12 has a number of suppression units 56, by means of which a specific frequency range of second digital signal 28 is analyzed and processed. Due to the overcompensation, therefore, the increase in the proportion of the reduction of noise 34, a substantially constant noise floor is provided in third digital signal 52. In this case, the maximum reduction is preferably set to the value by which the two spectra of noise 34 of the two settings 30, 32 differ.

The invention is not limited to the exemplary embodiments described above. Rather, other variants of the invention can also be derived herefrom by the skilled artisan, without going beyond the subject of the invention. Particularly, further, all individual features described in relation to the individual exemplary embodiments can also be combined with one another in a different manner, without going beyond the subject of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for operating a hearing device or hearing aid device, the method comprising:

providing a first analog signal;

generating a second analog signal via a preamplifier based on the first analog signal;

generating a first digital signal via an A/D converter based on the second analog signal;

generating a second digital signal by an amplifier based on the first digital signal; and generating a third digital signal in which a noise is reduced in comparison with the second digital signal by a noise suppression unit based on the second digital signal, wherein the preamplifier, amplifier, and noise suppression unit are set using a value characterizing the first digital signal, wherein a first digital auxiliary signal is generated based on the second digital signal by a first level adjustment unit of the noise suppression unit, wherein a second digital auxiliary signal is generated based on the first digital auxiliary signal by a noise level meter of the noise suppression unit, and wherein a noise floor, which corresponds to the noise of the second digital signal, is generated based on the second digital auxiliary signal by a second level adjustment unit.

2. The method according to claim 1, wherein the first analog signal is provided via a microphone.

3. The method according to claim 1, wherein the amplifier is set such that a gain ratio between the first analog signal and the second digital signal is constant.

4. The method according to claim 1, wherein a change in the characterizing value is transmitted to the noise suppression unit.

5. The method according to claim 1, wherein an adaptation rate of a noise level meter of the noise suppression unit is set using the characterizing value.

6. The method according to claim 1, wherein an expected noise form is adapted based on the characterizing value.

7. The method according to claim 1, wherein the first level adjustment unit and the second level adjustment unit are set based on the characterizing value, and wherein a suppression unit of the noise suppression unit is set independently of the characterizing value.

8. The method according to claim 1, wherein a Wiener filter is used for generating the third digital signal based on the second digital signal.

9. The method according to claim 1, wherein the proportion of the reduction of the noise is set as a function of the characterizing value.

10. A hearing device or a hearing aid device comprising:
a preamplifier;
an A/D converter connected downstream of the preamplifier in terms of signaling;
an amplifier connected downstream of said converter in terms of signaling; and
a noise suppression unit connected downstream of the amplifier,
wherein the hearing device is operated according to the method according to claim 1.

* * * * *